(12) United States Patent
Shih et al.

(10) Patent No.: US 6,424,024 B1
(45) Date of Patent: Jul. 23, 2002

(54) LEADFRAME OF QUAD FLAT NON-LEADED PACKAGE

(75) Inventors: Bor Shiun Shih, Taichung; Yueh-Ying Tsai, Ching Shui Chen, both of (TW)

(73) Assignee: Siliconware Precision Industries Co., Ltd., Taichung Hsien (TW)

( * ) Notice: Subject to any disclaimer, the term of this patent is extended or adjusted under 35 U.S.C. 154(b) by 0 days.

(21) Appl. No.: 09/767,420

(22) Filed: Jan. 23, 2001

(51) Int. Cl.$^7$ .................. H01L 23/495; H01L 21/50
(52) U.S. Cl. .................. 257/667; 257/666; 438/123; 438/124
(58) Field of Search .................. 257/666, 667, 257/787, 678, 783; 438/123, 124

(56) References Cited

U.S. PATENT DOCUMENTS

| | | | |
|---|---|---|---|
| 4,604,642 A | * 8/1986 | Sakurai | 257/787 |
| 5,942,794 A | 8/1999 | Okumura | 257/666 |
| 6,201,292 B1 | * 3/2001 | Yagi et al. | 257/666 |
| 2001/0030355 A1 | * 10/2001 | Mclellan et al. | 257/666 |

* cited by examiner

Primary Examiner—Jasmine J B Clark
(74) Attorney, Agent, or Firm—J. C. Patents

(57) ABSTRACT

A quad flat non-leaded package leadframe for supporting a die in a semiconductor package. The leadframe includes a plurality of packaging unit. Each packaging unit has a plurality of leads around a central region. Each pair of neighboring packaging unit is connected by a dam bar. The connected regions between the dam bar and the leads of each neighboring packaging unit have a thickness smaller than the other regions.

11 Claims, 6 Drawing Sheets

LEADFRAME OF QUAD FLAT NON-LEADED PACKAGE

BACKGROUND OF THE INVENTION

1. Field of Invention

The present invention relates to the leadframe of a quad flat non-leaded package. More particularly, the present invention relates to a quad flat non-leaded package having a leadframe that includes a thinner connected region.

2. Description of Related Art

Semiconductor packages can be roughly divided into pin through hole (PTH) type and surface mount type. The pin through hole (PTH) type is a type of package which leads can be inserted into a plurality of pre-drilled holes of a circuit board. Typical pin through hole (PTH) type package includes the dual in line (DIP) package and the pin grid array (PGA). The surface mount type package requires printing a solder paste over the corresponding mounting pads of a circuit board followed by a solder reflowing process. Conventional surface-mount packages include small outline package (SOP), quad flat package (QFP) and ball grid array (BGA).

Due to its limitation of pin count, the dual in line (DIP) type package is gradually phased out. In turn, the pin grid array (PGA) package is difficult to assemble and has surface area that is larger than other conventional packages, while the production cost is generally high. Among various types of packaging structure, the techniques for fabricating the quad flat package are currently mature.

The leads of a quad flat package extend from the periphery of the integrated circuit (IC) to four horizontal directions, while the pitch between the leads also shrinks from a former value of 1.27 mm to about 0.3 mm. Most of the quad flat packages are made of plastic. Currently, a quad flat package can have at most 300 external leads. At present, quad flat type package is employed to package logic IC and low-to-moderate level micro devices. The U.S. Pat. No. 5,942,794 discloses a quad flat non-leaded (QFN) package. "Non-leaded" means that the quad flat package does not have outer leads. Hence, signal transmission path is shortened and a signal decay thereby can be reduced.

The plastic molding process of a conventional quad flat non-leaded package can be roughly classified into strip mode (in strip mode, the leadframe of various packaging units are connected from one dimension) and array mode (in array mode, the leadframe of various packaging units are connected from two dimensions). No matter how various packaging units are connected together, the standard procedure for manufacturing the quad flat non-leaded package includes die bonding, wire bonding, molding and singulation.

FIG. 1 is a top view showing a leadframe of molded array type used to form an array of conventional quad flat non-leaded packages. As shown in FIG. 1, the leadframe 109 has a sheet structure. The leadframe 109 has a plurality of packaging units 111. Each packaging unit 111 can be divided into two major regions: a lead portion and a flat portion. The lead portion includes only internal leads 100. The flat portion includes a die pad 106 for holding a die 102 (the die 102 is shown in FIG. 2). To facilitate the automation of the production, the leadframe 109 may include side rails (not shown) for linking various packaging units and pilot holes (not shown) for an in-process alignment. The leadframe 109 also has tie bars 103 for fixing the die pad 106 in position relative to the leadframe 109. A dam bar 108 is used to connect various leads 100 with the side rails. The dam bar 108 also serves to prevent an extrusion of the plastic compound from occurring during the molding process. The dam bar 108 is also directed to linking various packaging units 111 inside the leadframe 109. The outermost packaging unit 111 is surrounded by the dam bars 108 and side rail.

FIG. 2 is a schematic cross-sectional view showing the leadframe in FIG. 1 after die attaching, wire-bonding, and encapsulating but before singulation. As shown in FIG. 2, the conventional quad flat non-leaded package comprises the die pad 106 and the plurality of inner leads 100 surrounding the die pad 106. The backside 102b of the die 102 is attached to the upper surface 106a of the die pad 106 using epoxy 101. Bonding pads (not shown) on the active surface 102a of the die 102 is electrically connected to the upper surface 100a of the inner leads 100 through the gold wires 104. The die 102, the gold wires 104, the upper surface 106a of the die pad 106, the upper surface 100a of the inner leads 100 are encapsulated by the molding compound 105. Only the lower surface 106b of the die pad 106 and the lower surface 100b of the inner leads 100 are exposed. Utilizing the exposed lower surface 100b of the inner leads 100, the package is connected to an external printed circuit board (not shown).

After encapsulating, the singulation process is conducted. The purpose of singulation is to separate the molded array package into individual package units 111. A basic criterion in singulation is the clean removal of excess plastic and dam bar material to form a smooth package. However, the hardened molding compound and the leadframe material have different physical properties. This may cause some problems in the cutting process because the cutting blade may distort the leadframe when encountering a non-uniform material.

There are three major drawbacks in a conventional quad flat non-leaded package, including:

1. Penetration of moisture: as shown in FIG. 2, due to distortion of the inner leads 100 in a quad flat non-leaded package after blade cutting, gaps are often formed between the inner leads 100 and the molding compound 105. Hence, moisture can easily penetrate into the package.

2. Outward-plugging of leads after singulation causes a drop in reliability: position of the cutting street 113 is indicated by dashed lines in FIGS. 1, 2 and 3. The cutting street 113 having a width A is the location where a cutting blade 107 (shown in FIG. 3) needs to pass through.

FIG. 3 is a cross-sectional view showing a cutting blade on top of the cutting street between two neighboring packages in an array of packages. As shown in FIG. 3, the cutting blade 107 is posed on top of the cutting street 113 at the junction of two packaging units 111.

In the conventional quad flat non-leaded package, the inner leads 100 have a uniform shape. Hence, some of the inner leads 100 can be easily pulled out from the molding compound 105 by the cutting blade 107 tension while cutting. FIG. 4 is a cross-sectional view of two quad flat packages after singulation showing some partially pulled inner leads.

3. Dam bar residues on packages is caused by a blade misalignment during singulation. As shown in FIG. 1, the cutting street 113 has a width A, and the leadframe 109 has a thickness $t_1$ as shown in FIG. 2. According to general design rules, dam bar should have a minimum width $w_1$ of about $0.7t_1$. Consequently, maximum misalignment tolerance of the cutting blade is $A-w_1/2=A-0.7t_1/2=0.5A-0.35t_1$. In general, width A of the cutting street 113 is about 0.3 mm (width of the cutting blade 107) and the leadframe 109 has a thickness $t_1$ of about 0.2 mm. Following standard design rule, the dam bar thus should have a width 0.7×0.2=0.14 mm. Hence, the misalignment tolerance of the cutting blade is (0.3−0.14)/2=0.08. Such a small tolerance of the cutting blade often results in the attachment of some dam bar residue on the package leading to poor package products. FIG. 5 is a top view showing dam bar residue on singulated quad flat non-leaded packages. As shown in FIG. 5, a portion of the dam bar material is attached to the package after singulation. Hence, a lower production yield is obtained.

SUMMARY OF THE INVENTION

One object of the present invention is to provide a leadframe having a thinner connected region that can lower the cutting force on a blade required to perform singulation.

Another object of the present invention is to provide a leadframe having a thinner connected region that can reduce the attachment of dam bar residue to a singulated package due to the blade misalignment.

Yet, another object of the present invention is to provide a leadframe having a thinner connected region that can strengthen the adherence between the leads and the molding compound and thus increase overall reliability of the package.

To achieve these and other advantages and in accordance with the purpose of the invention, as embodied and broadly described herein, the invention provides a leadframe structure for supporting a die within a quad flat non-leaded package. The leadframe structure includes a plurality of packaging units. Each packaging unit has a plurality of leads surrounding a die pad. There is a dam bar between neighboring packaging units. The dam bar and the junction between the leads of neighboring packaging units have a section that is relatively thinner than regions elsewhere.

According to this invention, the leadframe is half-etched to form a thinner connected section along the cutting street.

By reducing the thickness of the cutting street, the depth of cutting for a cutting blade during singulation are substantially reduced. Ultimately, the probability of pulling any lead out of the matrix of plastic material that encloses the leadframe is reduced. Furthermore, the reduction of thickness in the local lead region facilitates the formation of a step structure close to the tip of the leads, thereby strengthening the adherence between the leads and the molding compound. In addition, the thinner connected regions on the leadframe reduce the width of the dam bar. Hence, a larger cutting blade misalignment can be tolerated. Overall, a higher singulation yield can be attained.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
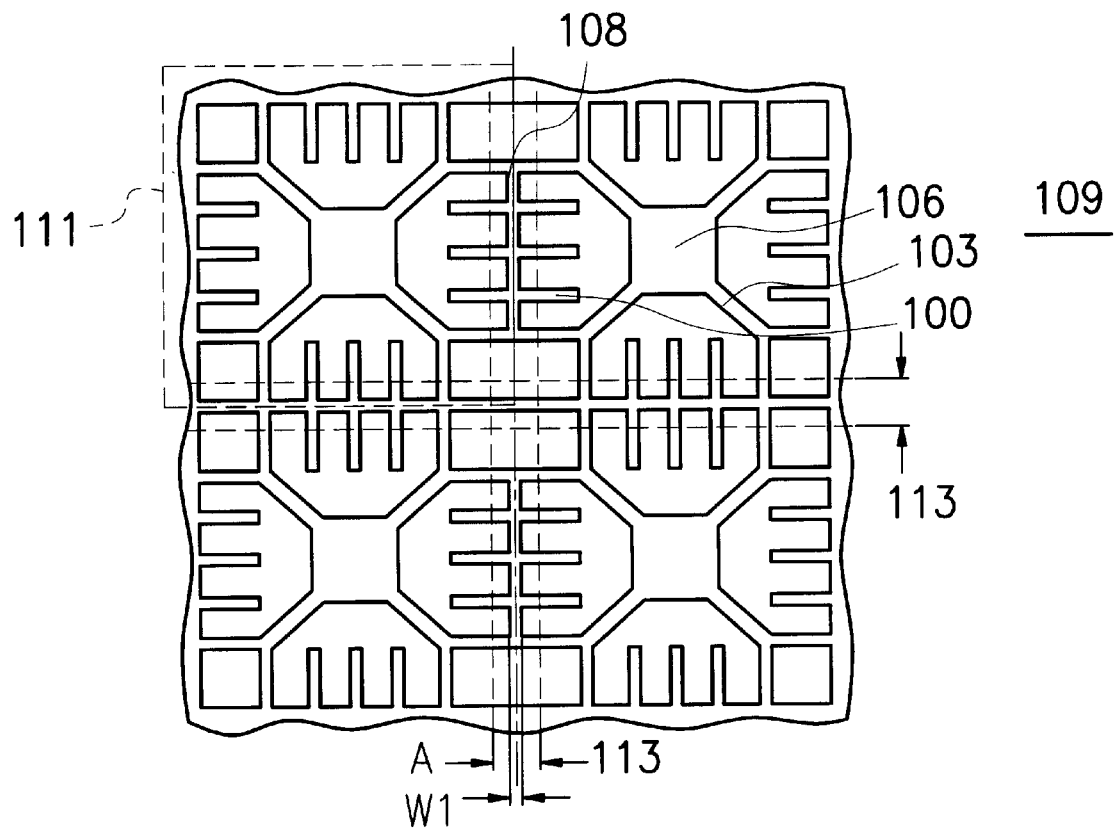
FIG. 1 is a top view showing an array of leadframes enclosed by molding compound to form an array of conventional quad flat non-leaded packages.
Figure 2:
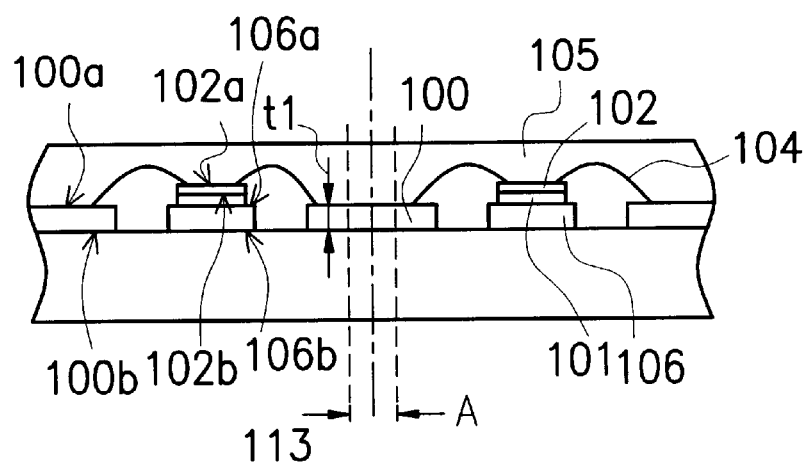
FIG. 2 is a schematic cross-sectional view showing the leadframe in FIG. 1 after die attaching, wire-bonding, plastic molding but before singulation.
Figure 3:
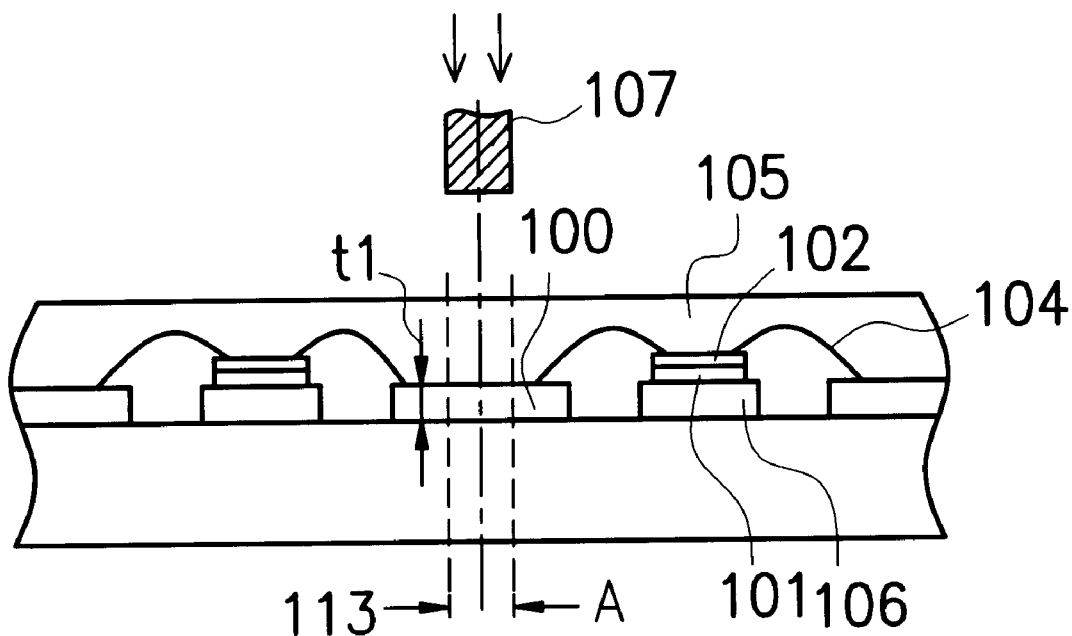
FIG. 3 is a cross-sectional view showing a cutting blade on top of the cutting street between two neighboring packages of an array of packages.
Figure 4:
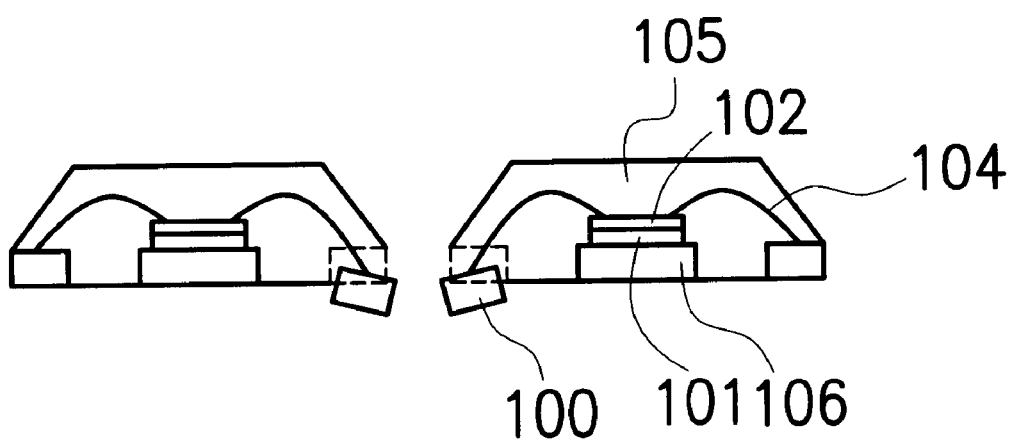
FIG. 4 is a cross-sectional view of two quad flat non-leaded packages after singulation showing some partially pulled inner leads.
Figure 5:
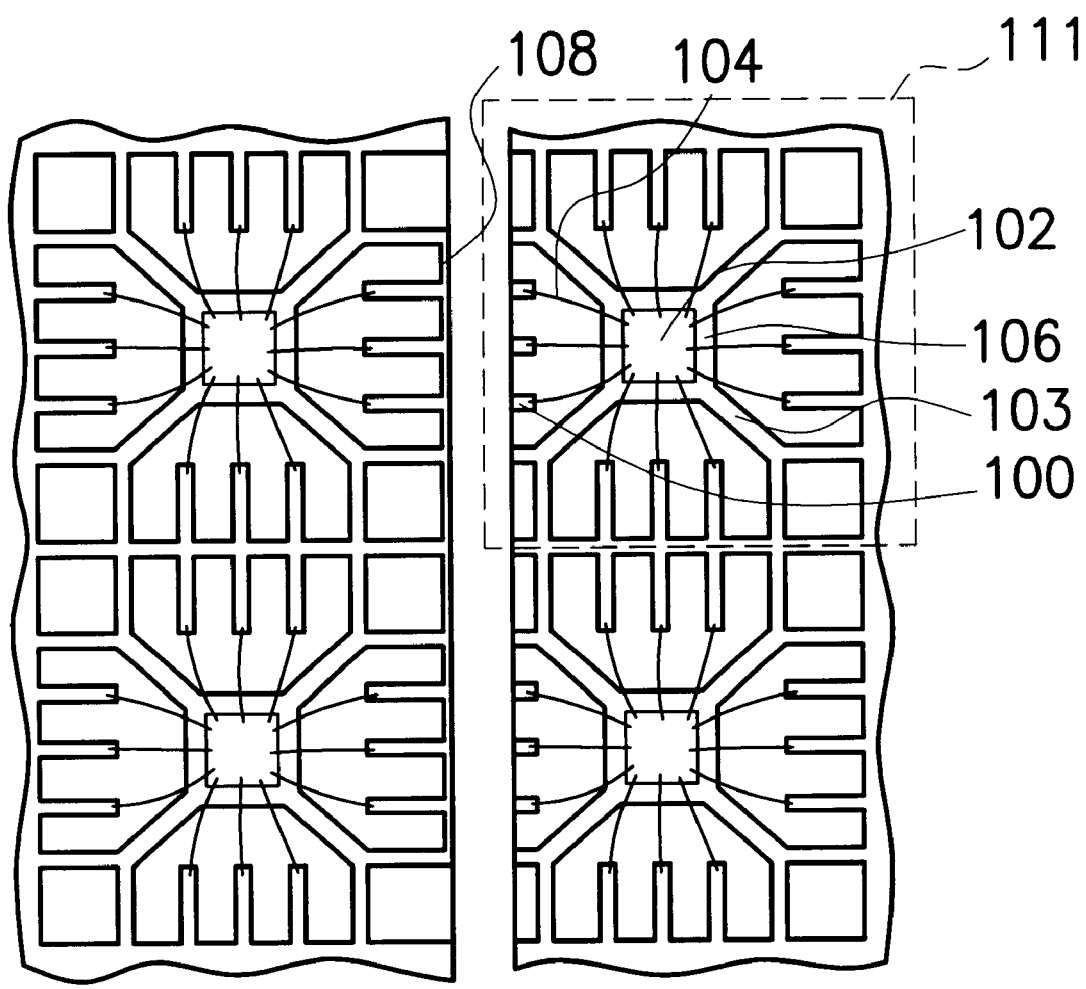
FIG. 5 is a top view showing dam bar residues on singulated quad flat non-leaded packages.

Reference will now be made in detail to the present preferred embodiments of the invention, examples of which are illustrated in the accompanying drawings. Wherever possible, the same reference numbers are used in the drawings and the description to refer to the same or like parts.

Figure 6:
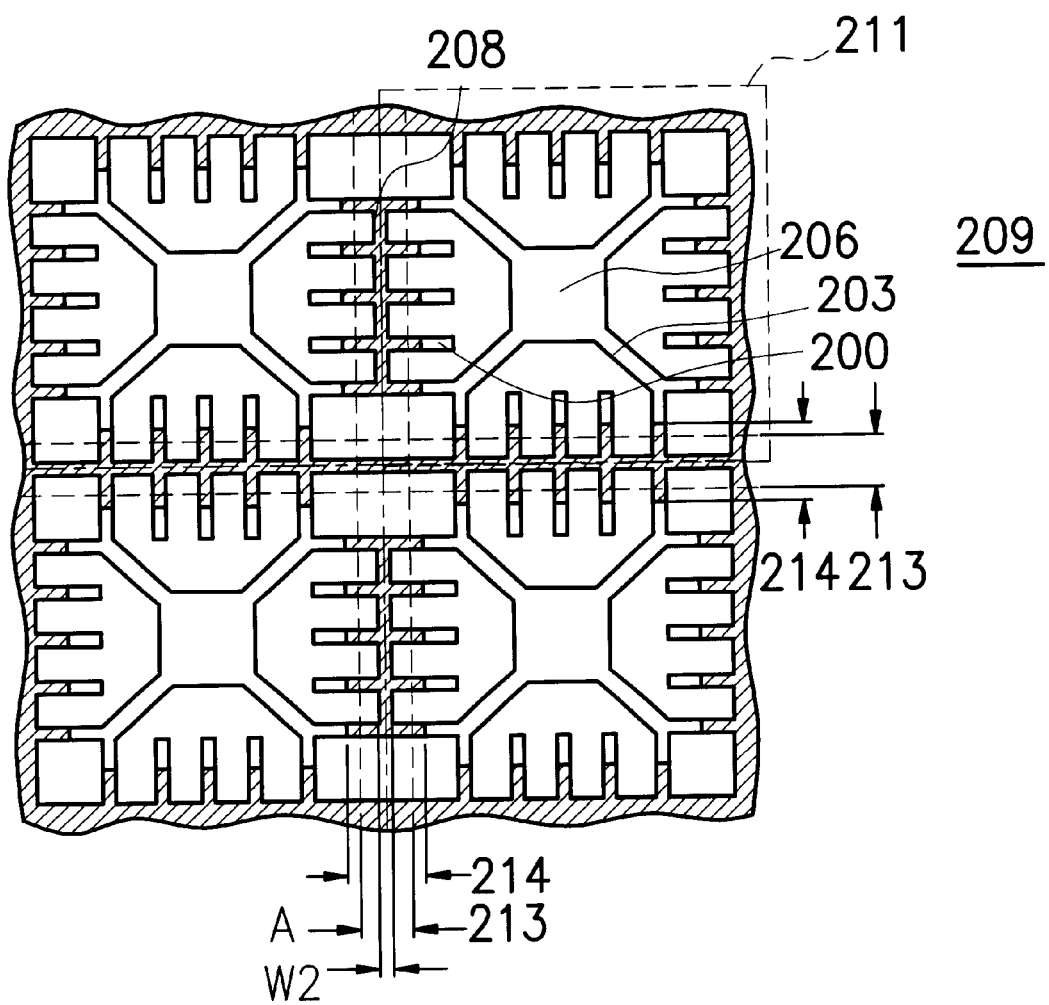
FIG. 6 is a top view showing an array of leadframes enclosed by molding compound to form an array of quad flat non-leaded packages according to one preferred embodiment of this invention.

FIG. 6 is a top view showing an array of leadframes used to form an array of quad flat non-leaded packages according to one preferred embodiment of the present invention. Referring to FIG. 6, before any additional processing, the leadframe 209 has a sheet structure. The leadframe 209 has an array of packaging units 211. Each packaging unit 211 can be divided into two major regions: a lead portion and a flat portion. The lead portion includes only internal leads 200. The flat portion includes a die pad 206 for holding a die. To facilitate the automation of the production, the leadframe 209 may include side rails (not shown) for linking various packaging units and pilot holes (not shown) for in-process alignment. In addition, the leadframe 209 also has tie bars 203 for fixing the die pad 206 in position relative to the leadframe 209. A dam bar 208 is used to connect various leads 200 with the side rails. The dam bar 208 also serves to prevent extrusion of plastic compound during molding. The dam bar 208 is also responsible for linking various packaging units 211 inside the leadframe 209. The outermost packaging unit 211 is surrounded by dam bars 208 and side rail.

Figure 7:
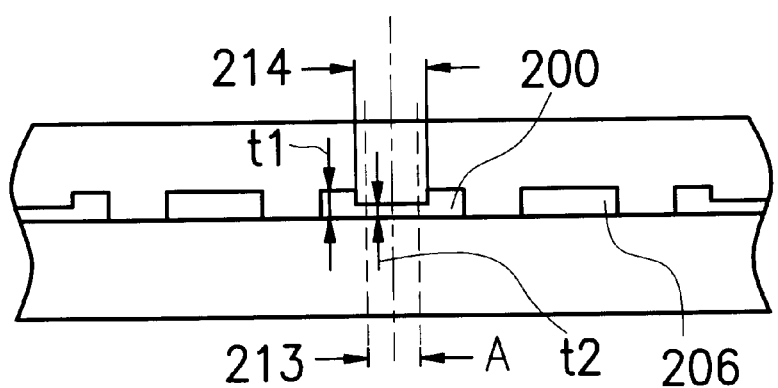
FIG. 7 is a cross-sectional side view of the packages of FIG. 6.

To prevent the penetration of moisture into the package, a half-etching process is conducted when the leadframe 209 is fabricated. In other words, the cutting street 213 and a portion of the inner leads 200 that surround various packaging units 211 are etched to form thinner connected regions 214 marked by the slashed lines in FIG. 6. In this embodiment, the thinner connected regions 214 include all of the cutting street 213 and about ½ to ⅔ of the inner leads 200 that surrounds the various packaging unit 211. However, the thinner connected regions 214 of this invention is not limited to any particular length of the inner leads 200, as long as the cutting street 213 are included. In this embodiment, after half-etching, the thinner connected regions 214 has a thickness $t_2$ that is about half of the thickness t1 of the leadframe 209. In other words, $t_2=0.5t_1$ (see FIGS. 6 and 7).

Figure 8:
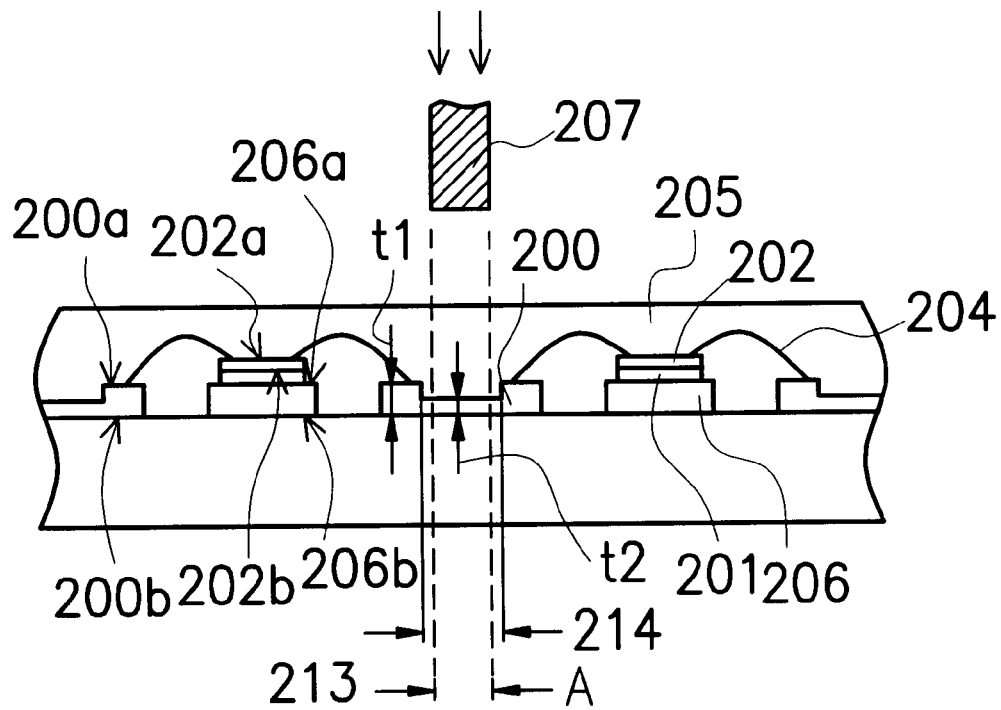
FIG. 8 is a cross-sectional view showing a cutting blade on the top of the cutting street between two neighboring packages of an array of packages ready for singulation according to this invention.

FIG. 8 is a cross-sectional view showing a cutting blade on top of the cutting street between two neighboring packages in an array of packages ready for singulation according to this invention. As shown in FIG. 8, a quad flat non-leaded package comprises a die pad 206 and a plurality of inner leads 200 surrounding the die pad 206. The backside 202b of a die 202 is attached to the upper surface 206a of the die pad 206 using silver paste 201 or other adhesive. Bonding pads (not shown) on the active surface 202a of the die 202 is electrically connected to the upper surface 200a of the inner leads 200 through gold wires 204. The die 202, the gold wires 204, the upper surface 206a of the die pad 206, the upper surface 200a of the inner leads 200 are encapsulated by molding compound 205. Only the lower surface 206b of the die pad 206 and the lower surface 200b of the inner leads 200 are exposed. Utilizing the exposed lower surface 200b of the inner leads 200, the package is connected to an external printed circuit board (not shown). As shown in FIG. 8, the cutting blade is posed in a position above the cutting street 213. The thinner connected regions 214 has a thickness t2 that is about half of the thickness $t_1$ of the leadframe 209, that is $t_2=0.5t_1$. According to design rules, the minimum width $w_2$ of the dam bar 208 is about 0.7 times its thickness, that is $w_2=0.7t_2$ (see FIG. 7). Since the dam bar 208 has a thickness $t_2$ that is only half of the thickness $t_1$ of the leadframe 209 due to half-etching process, the width $w_2$ of the dam bar 208 can be designed to be just 0.35 times the thickness $t_1$ of the leadframe, that is $w_2=0.35t_1$.

Figure 9:
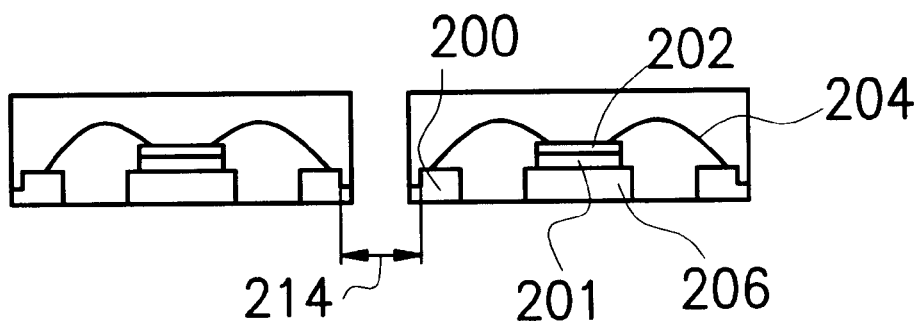
FIG. 9 is a cross-sectional view of two neighboring packing units after singulation according to this invention.
Figure 10:
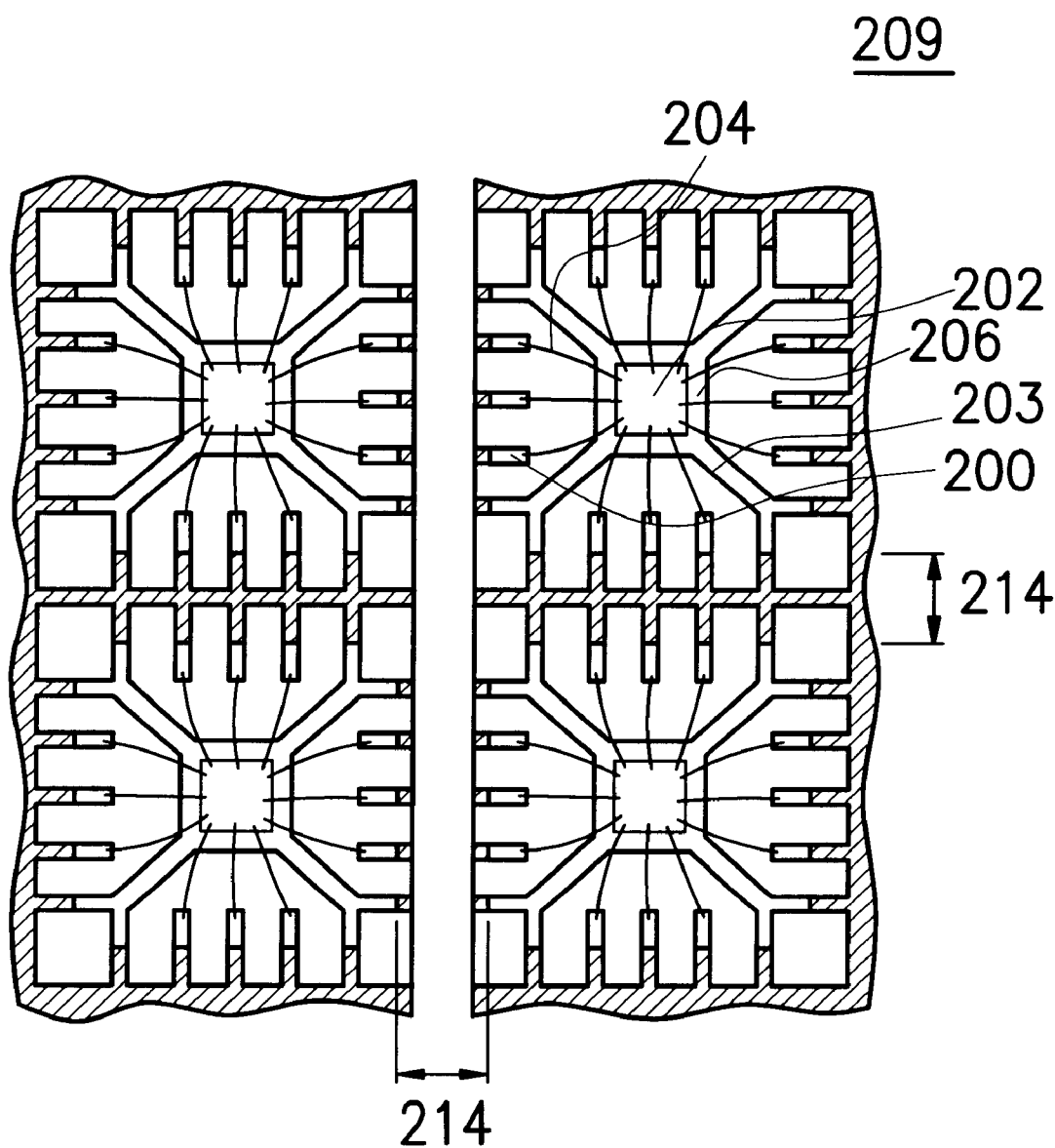
FIG. 10 is a top view of the structure shown in FIG. 9.

In summary, the quad flat non-leaded package of this invention has four major advantages over a conventional package, including:

1. The package is moisture resistant: as shown in FIG. 9 (FIG. 9 is a cross-sectional view of two neighboring packaging units after singulation according to this invention), the inner leads 200 is step-shaped. Hence, moisture penetration path in the quad non-leaded package is extended, so that the moisture does not easily penetrate into the package.
2. Leads are difficult to plug out from molding compound, resulting in higher reliability. Since the inner leads 200 is step-shaped, they have greater contact surface with the molding compound 205. Hence the adherence between molding compound and inner lead is greater than when the conventional lead has a uniform shape. Consequently, the inner leads 200 are less likely to be dislodged from the molding compound after singulation.
3. The resistance to the cutting blade can be reduced. The cutting street 213 is enclosed in dash lines in FIG. 8. The width of the cutting blade 207 is A while the leadframe has a thickness $t_1$. Typically, the thickness $t_1$ of the leadframe is about 0.2 mm and the blade 207 thickness A is about 0.3 mm. Since the cutting street 213 is half-etched, the cutting blade 207 only has to drive through an overall thickness $t_2$ of about $t_1/2$. In other words, the cutting thickness is 0.1 mm instead of 0.2 mm. Hence, the cutting blade is subjected to a smaller resistant.
4. Dam bar residue is less likely to remain after singulation even if the cutting blade is slightly mis-aligned. As shown in FIG. 8, the leadframe has a thickness $t_1$ and the cutting street 213 has a thickness A (width of the cutting blade 207). In this invention, as shown in FIG. 6, the dam bar 208 has a width $w_2$ of about $0.35t_1$. Consequently, the maximum misalignment tolerance of the cutting blade is $A-w_2/2=A-0.35t_1/2=0.5A-0.175t_1$. In general, width A of the cutting street 213 is about 0.3 mm (which corresponds to the width of the cutting blade 207) and the leadframe 209 has a thickness $t_1$ of about 0.2 mm. Following standard design rule, the dam bar 208 should have a width w2 of about 0.35×0.2=0.07 mm. The tolerance of misalignment of the cutting blade is about (0.3−0.07)/2=0.165, which is a much larger tolerance than a conventional cutting blade. Hence, very little dam bar residues will remain after singulation. FIG. 9 is a cross-sectional view of two neighboring packaging units after singulation according to this invention; and FIG. 10 is a top view of the structure shown in FIG. 9.

In accordance with the foregoing description of the embodiment of the present invention, at least the following advantages can be obtained.

According to an advantage of the quad flat non-leaded package of the present invention, since the leadframe has the thinner connected regions while the inner leads are step-shaped, the moisture penetration path in the package can be extended so that the moisture does not easily penetrate into the package.

According to another advantage of the quad flat non-leaded package of the present invention, since the leadframe has the thinner connected regions while the inner leads are step-shaped, the adhesive surface between the inner leads of the invention and the molding compound thus is greater than the adhesive surface between the conventional uniformly shaped inner leads and the molding compound, which thereby increases the adherence therebetween and substantially reduces the occurrence of inner lead pulling out during the singulation process.

According to another advantage of the quad flat non-leaded package of the present invention, since the leadframe has the thinner connected regions while the inner leads are step-shaped, thus the cutting blade and the depth of the cutting street can be reduced to be equal to the thickness of the leadframe while performing the singulation process. As a result, the cutting resistance can be reduced.

According to another advantage of the quad flat non-leaded package of the present invention, since the leadframe has the thinner connected regions, the width of the dam bars thus can be designed smaller. As a result, while having the same thickness and the same width of the cutting blade, the misalignment tolerance of the cutting blade can be greater, and the dam bar residue issue thus can be prevented.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A quad flat non-leaded package leadframe comprising:
   a plurality of packaging units, each having a plurality of leads around a central location; and
   a dam bar between each pair of neighboring packaging unit and connected to the leads of the respective packaging unit;
   wherein the connected regions between the dam bar and the leads close to packaging unit has a thickness smaller than other regions.

2. The leadframe of claim 1, wherein each packaging unit further includes a die pad located in the central location of the packaging unit.

3. The leadframe of claim 1, wherein the dam bar and the leads close to the packaging unit has a thickness only half that of the other regions.

4. The leadframe of claim 1, wherein width of the dam bar is about 0.7 times that of its thickness.

5. The leadframe of claim 1, wherein thickness of the leadframe in the dam bar and the connected regions close to the packaging unit is reduced by performing a half-etching operation.

6. A quad flat non- leaded package comprising:

a die;

a plurality of leads around the die, each lead having an upper surface and a lower surface, wherein the upper surfaces of the leads are electrically connected to the die and a portion of each lead away from the die has a thickness smaller than other regions, the thinner portion occupies approximately ½ to ⅔ of the overall length of each lead; and a molding compound that encapsulates the die and the upper surface of the leads while exposing the lower surface of the leads.

7. The package of claim 6, wherein the quad flat non-leaded package further includes a die pad onto which the die is attached.

8. The package of claim 6, wherein the lead away from the die has a thickness that is approximately half that of other regions.

9. The package of claim 6, wherein the leads are electrically connected to the die through a plurality of gold wires.

10. A quad flat non-leaded package comprising:

a die;

a plurality of leads around the die, each lead having an upper step-shaped side and a lower side, the die being electrically connected to the upper step-shaped side; and a molding compound that encapsulates the die and the upper step-shaped sides of the leads while exposing the lower sides of the leads, wherein the upper step-shaped sides of the leads prevent substantial moisture penetration through the molding compound into the interior of the package and improve the adherence of the leads to the molding compound.

11. The package of claim 10, wherein the quad flat non-leaded package further includes a die pad onto which the die is attached.

* * * * *